US011777415B2

(12) United States Patent
Parnell et al.

(10) Patent No.: US 11,777,415 B2
(45) Date of Patent: Oct. 3, 2023

(54) SYNCHRONOUS RECTIFICATION TO MITIGATE RAIL PUMPING IN A SINGLE-ENDED CLASS D AMPLIFIER

(71) Applicant: HARMAN INTERNATIONAL INDUSTRIES, INCORPORATED, Stamford, CT (US)

(72) Inventors: Matthew Ryan Parnell, Livonia, MI (US); Nathan Richard Dort, Plymouth, MI (US)

(73) Assignee: Harman International Industries, Incorporated, Stamford, CT (US)

( * ) Notice: Subject to any disclaimer, the term of this patent is extended or adjusted under 35 U.S.C. 154(b) by 333 days.

(21) Appl. No.: 17/240,268

(22) Filed: Apr. 26, 2021

(65) Prior Publication Data
US 2022/0345047 A1  Oct. 27, 2022

(51) Int. Cl.
*H03F 3/217* (2006.01)
*H03F 3/185* (2006.01)
*H02M 3/335* (2006.01)

(52) U.S. Cl.
CPC ...... *H02M 3/33592* (2013.01); *H03F 3/2173* (2013.01)

(58) Field of Classification Search
CPC .... H02M 3/33592; H02M 7/219; H02M 1/32; H03F 3/2173; H03F 3/2171; H03F 3/187; H03F 3/217; H03F 2200/03
USPC ............................. 330/10, 207 A, 251, 297
See application file for complete search history.

(56) References Cited

U.S. PATENT DOCUMENTS

| 7,839,215 | B2 | 11/2010 | Mendenhall | |
|---|---|---|---|---|
| 9,973,158 | B1 * | 5/2018 | Mendenhall | ......... H03F 3/2173 |
| 10,014,831 | B1 * | 7/2018 | Buono | ................. H03F 3/2171 |

(Continued)

FOREIGN PATENT DOCUMENTS

EP      1987585 A1    11/2008

OTHER PUBLICATIONS

Xu Duo et al: "Front-End Bidirectional Symmetric Bipolar Outputs LLC DC-Transformer (DCX) for a Half Bridge Class-D Audio Amplifier", IEEE Transactions on Industrial Electronics, IEEE Service Center, Piscataway, NJ, USA, vol. 68, No. 11, Nov. 19, 2020 (Nov. 19, 2020), pp. 10750-10760.

(Continued)

*Primary Examiner* — Hieu P Nguyen
(74) *Attorney, Agent, or Firm* — Brooks Kushman, P.C.

(57) ABSTRACT

An amplifier system may include at least one input source, a converter configured to provide voltage rails to an amplifier, the voltage rails including a first voltage rail and a second voltage rail, a MOSFET arranged at a secondary side of the system at the first voltage rail, a second MOSFET arranged at the first voltage rail, a third MOSFET arranged at the second voltage rail, a fourth MOSFET arranged at the second voltage rail; and, a first capacitor arranged at the first voltage rail and a second capacitor arranged at the second voltage rail, the first and forth MOSFETS are configured to operate simultaneously with one another and the second and third MOSFETs are configured to operate simultaneously with one another and opposite of the first and fourth MOSFETs so as to allow synchronous rectification so that the first and second capacitors reciprocally and mutually exclusively charge and discharge.

14 Claims, 5 Drawing Sheets

(56) References Cited

U.S. PATENT DOCUMENTS

2009/0309658 A1　12/2009　Mendenhall
2018/0123534 A1　5/2018　Mendenhall

OTHER PUBLICATIONS

Huang Rui et al: "Embedded Bidirectional 1-14 Buck-Boost Converter in Half Bridge Class-D Audio Amplifier for Suppressing Bus Voltage Pumping", IEEE Transactions on Industrial Electronics, IEEE Service Center, Piscataway, NJ, USA, vol. 69, No. 2, Feb. 9, 2021 (Feb. 9, 2021), pp. 1454-1464.
Zhou Xiang et al: "An Electrolytic 1-14 Capacitor-Free Half Bridge Class-D Audio Amplifier System Without Bus-Voltage Pumping", IEEE Transactions on Power Electronics, Institute of Electrical and Electronics A Technical Fields Searched (IPC) Engineers, USA, vol. 36, No. 8, Jan. 6, 2021 (Jan. 6, 2021), pp. 9221-9236.

\* cited by examiner

US 11,777,415 B2

SYNCHRONOUS RECTIFICATION TO MITIGATE RAIL PUMPING IN A SINGLE-ENDED CLASS D AMPLIFIER

TECHNICAL FIELD

Disclosed herein are systems and methods to mitigate rail pumping in class-D amplifiers.

BACKGROUND

Class D amplifiers operate as switching amplifiers wherein the switches are either on or off, as opposed to Class A, A/B, or B amplifier designs that have longer periods of time during which the switches are operated in the linear region where the output devices have higher power dissipation. Because Class D amplifiers switch the output devices between the off and on states, they dissipate much less power compared to other amplifier designs.

Class D amplifiers with single ended output loads and split voltage rails face a phenomenon called power supply "rail pumping" (or "bus pumping") during operation at low frequency and high power, especially when driving low impedance loads. This phenomenon results in the Class D power supply voltage rails increasing in magnitude. The higher power supply voltage rails result in additional losses and electrical stresses on the Class D amplifier semiconductors. Capacitors and semiconductors with higher voltage ratings are therefore used which adds cost to the system. Additionally, the higher the semiconductor voltage ratings, the slower their switching speed, resulting in additional losses. The overall losses increase with lower audio frequency, higher power operation, and increased number of audio channels.

SUMMARY

An amplifier system may include at least one input source, a converter configured to provide voltage rails to an amplifier, the voltage rails including a first voltage rail and a second voltage rail, a first metal-oxide-semiconductor field-effect transistor (MOSFET) MOSFET arranged at a secondary side of the system at the first voltage rail, a second MOSFET arranged at the first voltage rail, a third MOSFET arranged at the second voltage rail, a fourth MOSFET arranged at the second voltage rail; and, a first capacitor arranged at the first voltage rail and a second capacitor arranged at the second voltage rail, wherein the first and forth MOSFETS are configured to operate simultaneously with one another and wherein the second and third MOSFETs are configured to operate simultaneously with one another and opposite of the first and fourth MOSFETs so as to allow synchronous rectification so that the first capacitor and second capacitor reciprocally and mutually exclusively charge and discharge.

An amplifier system may include at least one input source, a converter configured to provide voltage rails to an amplifier, the voltage rails including a first voltage rail on a first side of the converter and a second voltage rail on a second side of the converter, at least one first MOSFET arranged at the first side, at least one second MOSFET arranged at the second side, and a first capacitor arranged at the first side and a second capacitor arranged at the second side, wherein the first and second MOSFETS are configured to operate singly from one another so as to allow synchronous rectification so that the first capacitor and second capacitor reciprocally and mutually exclusively charge and discharge to mitigate rail pumping.

An amplifier system may include at least one input source, a converter configured to provide a first voltage rail and a second voltage rail to an amplifier, a first metal-oxide-semiconductor field-effect transistor (MOSFET) arranged at a secondary side of the system at the first voltage rail, a second MOSFET arranged at the second voltage rail, and a first capacitor arranged at the first voltage rail and a second capacitor arranged at the second voltage rail, wherein the first and second MOSFETS are configured to operate singly from one another so as to allow synchronous rectification so that the first capacitor and second capacitor reciprocally and mutually exclusively charge and discharge to mitigate rail pumping, and at least one diode associated with each of the MOSFETS, wherein each of the diodes is configured to operate simultaneously with the associated MOSFET to allow current to flow through the opposite one of the voltage rails.

BRIEF DESCRIPTION OF THE DRAWINGS

The system may be better understood with reference to the following drawings and description. The components in the figures are not necessarily to scale, emphasis instead being placed upon illustrating the principles of the invention. Moreover, in the figures, like-referenced numerals designate corresponding parts throughout the different views.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

Class D amplifiers with single ended output loads and split voltage rails face a phenomenon called power supply "rail pumping" (or "bus pumping") during operation at low frequency and high power, especially when driving low impedance loads. This phenomenon results in the Class D power supply voltage rails increasing in magnitude. When the amplifier produces low-frequency output, particularly on multiple channels simultaneously (and in phase), the power supply voltage rails may be pumped or boosted well beyond their intended potential. The higher power supply voltage rails result in additional losses and electrical stresses on the Class D amplifier semiconductors, causing component degradation or failure over time.

Capacitors and semiconductors with higher voltage ratings are therefore used, as well as other clamping mechanisms, all which add costs to the system. Additionally, the higher the semiconductor voltage ratings, the slower their switching speed, resulting in additional losses. The overall losses increase with lower audio frequency, higher power operation, and increased number of audio channels. Diode rectifiers may also be used to convert the alternating current (AC) from the transformer into direct current (DC), and may block reverse current that would otherwise flow during rail pumping.

Disclosed herein are systems and methods to mitigate rail pumping in class D amplifiers. The systems and methods may include various metal-oxide-semiconductor field-effect transistors (MOSFETs) in place of diodes to allow for bi-directional current flow. Additionally, these components allow for synchronous rectification, allowing the power supply to recirculate current to the opposing rail, thereby clamping the effects of rail pumping and increasing efficiency. Synchronous rectification allows for bi-directional current flow. The system determines when the rectifier can pass forward/reverse current instead of using diodes, which block reverse current.

Figure 1:
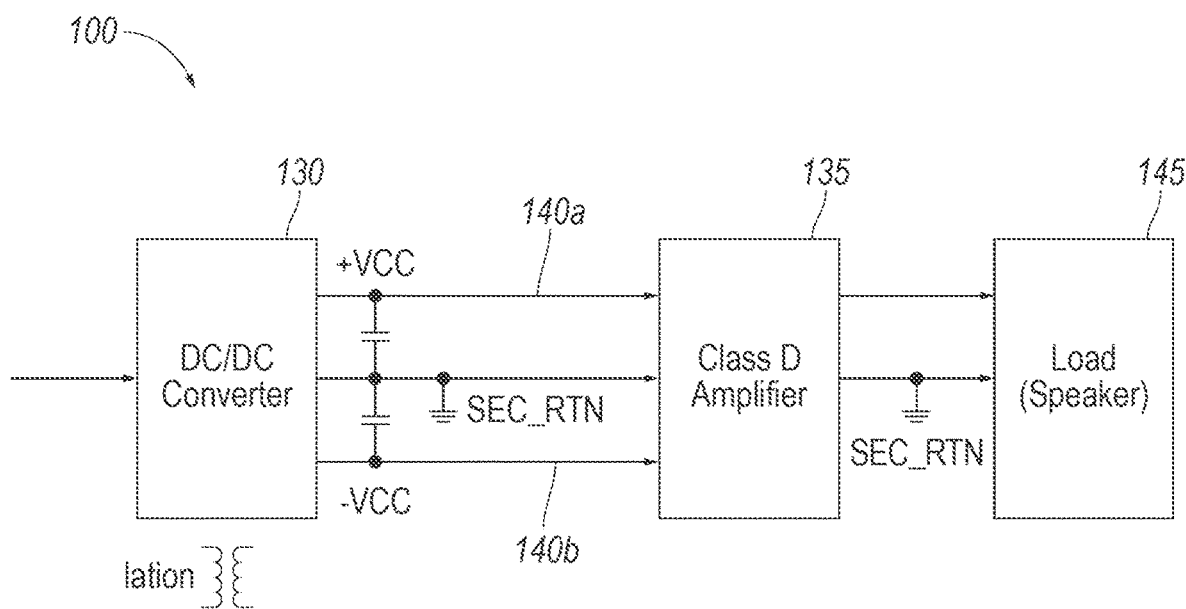
FIG. 1 illustrates an example system diagram for a Class D amplifier system.

FIG. 1 illustrates an example system diagram for a Class D amplifier system 100. A DC-DC converter 130 may receive DC power. The converter may be a current-fed push pull. The DC power may be sourced from a vehicle battery and may be a tracking power supply (TPS). Additionally or alternatively the power may be sourced from a power factor correction circuit to ensure the input current is in phase with the voltage, reduce line harmonics, distortion and peak currents. This may be the case in systems that include a mains-connected amplifier receiving power from an AC source. In this example, various filters, such as an electromagnetic interference (EMI) filter may receive power from the AC source to suppress electromagnetic noise generated by the various power supply circuits in the system. This may be especially important since high-frequency components of Class D amplifiers tend to generate spurious EMI that may disrupt operation of other components, circuits, and systems. A line relay may be configured to receive the filtered AC input from the EMI filter to provide the filtered AC input to a bridge rectifier. The rectifier may then convert the AC voltage input to full wave rectified DC voltage output.

The converter 130, as explained above, is typically a single isolated and unregulated DC/DC converter that supplies+/–VCC voltage rails (e.g., a first positive voltage rail (+VCC) 140a and a second negative voltage rail (–VCC) 140b) to the Class D amplifier 135. The amplifier 135 then provides the power to the load 145 or speaker for playback. Typical converters 130 may include DC/DC converter topologies such as current-fed push pull, LLC (half-bridge, full-bride), phase shifted full bridge, dual active bridge, etc.

Figure 2:
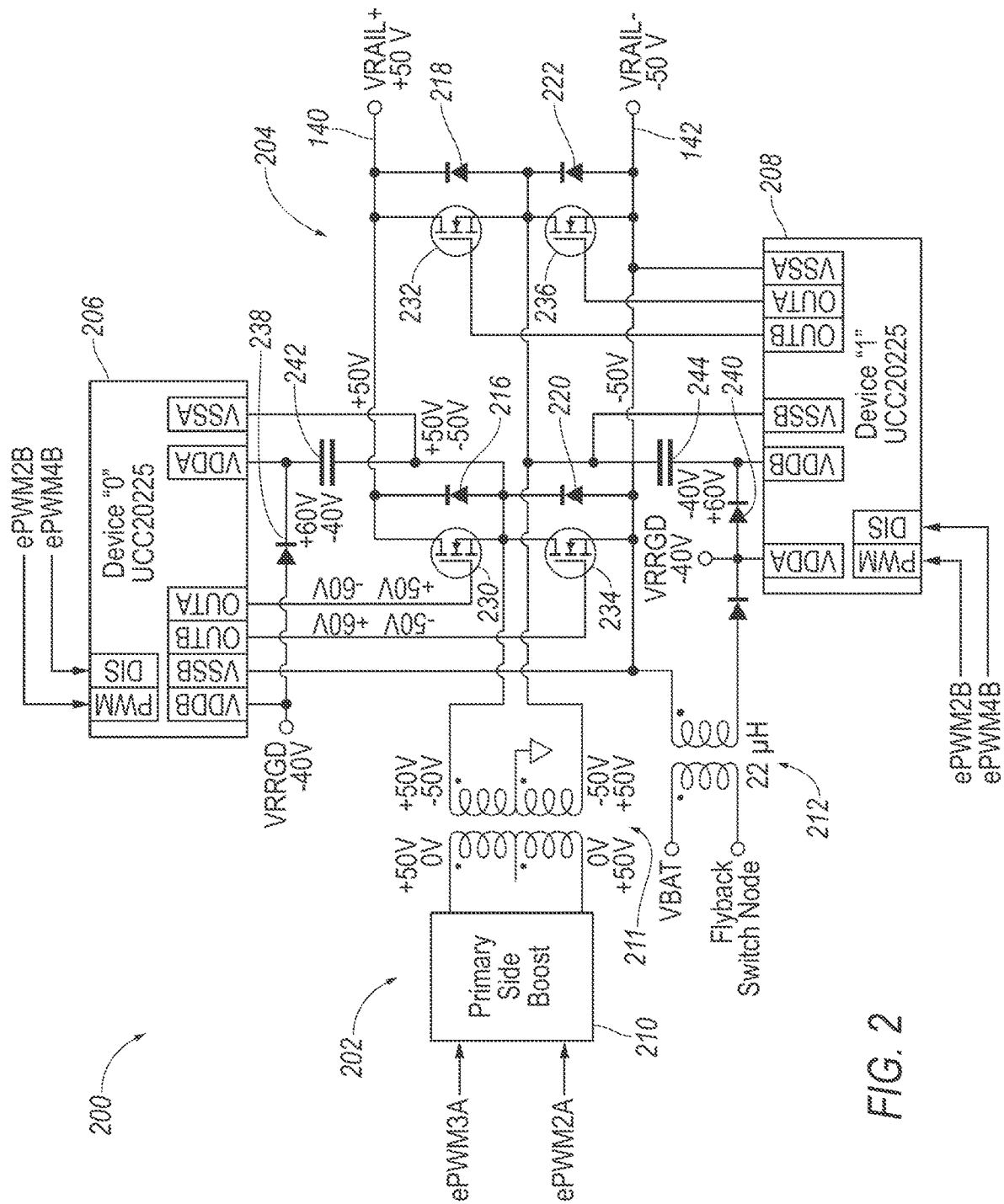
FIG. 2 illustrates an example schematic of a portion of the system of FIG. 1.

FIG. 2 illustrates an example power supply having a primary side 202 and a secondary side 204. The amplifier system 200 may include the converter 130 and/or the class D amplifier 135. In the example shown, the system 200 may be a single half bridge amplifier having a half-bridge converter 211. The amplifier 135 may include various drivers, including a first driver 206 and a second driver 208 on the secondary side 204. A booster 210 may be arranged on the primary side 202 at the converter 211 configured to receive the DC power supply. The system 200 may also include a flyback converter 212.

The voltage rails 140, 142 may each include a pair of diodes. The first voltage rail 140, also referred to herein as a first side and positive side, may include a first diode 216 and a second diode 218. The second voltage rail 142, also referred to herein as a second side and negative side, may include a third diode 220 and a fourth diode 222. A pair of metal-oxide-semiconductor field-effect transistors (MOSFETS) may be associated with each voltage rail 140, 142. A first MOSFET 230 may be arranged parallel with the first diode 216, a second MOSFET 232 may be arranged parallel with the second diode 218, a third MOSFET 234 may be arranged in parallel with the third diode 220, and a fourth MOSFET 236 may be arranged in parallel with the fourth diode 222.

A pair of bootstrap diodes, including a first bootstrap diode 238, also referred to as first ground diode 238, and a second bootstrap diode 240, also referred to as second first ground diode 238, may be arranged at each of the converters 211, 212. A pair of capacitors, including a first capacitor 242 and a second capacitor 244 may also be arranged at each of the converters 211, 212. The capacitors may be configured to store energy. The capacitors 242, 244, as explained herein, may store energy alternatively to one another, that is as one charges, the other discharges.

A loaded converter output is the side of the power supply that supplies a first supply voltage to the respective rail from which the class D amplifier is currently drawing power. An unloaded converter is the portion that supplies a second supply voltage to the second rail and is not intended to be currently drawing power. That is, when power is supplied on the first rail 140, that side of the transformer is loaded and the opposite side associated with the second rail 142 is unloaded. The converse is true in that when the second rail 142 is powered the associated side of the transformer is loaded with the side of the transformer associated with the first rail 140 is unloaded. Off-side charging, or rail pumping, occurs in class D amplifiers as the load of the amplifier is coupled between the loaded converter output. Rail pumping will cause the boosting beyond rated or intended magnitude levels on the unloaded rail.

In order to mitigate the load or boost at the unloaded rail, the system 200 may carefully operate the MOSFETs and diodes to not block reverse current, allowing current to flow through the opposite transformer side. In operation, a first set of components will be active while a second set of components is not, and the second set will be active while the first set is not. For example, the first set may include the first and fourth MOSFET/diode pairs, as well as the second bootstrap diode 240. The first set may operate simultaneously. For example, the first MOSFET 230, the first diode 216, fourth MOSFET 236, fourth diode 222, and second bootstrap diode 240 may all be active simultaneously. Conversely, the second and third MOSFET/diode pairs will operate simultaneously with one another. The second MOSFET 232, the second diode 218, third MOSFET 234, third diode 220, and first ground diode 238 may all be active simultaneously, but the first or fourth MOSFET/diodes will not be.

When the first set of components is active, the first capacitor 242 may store energy as current is passed therethrough. The second capacitor 244 may discharge. When the second set of components are active, the second capacitor 244 may charge, while the first capacitor 242 is discharged. This may be possible due to current being permitted to flow through the respective capacitors and not be blocked by commonly used diode rectifiers.

Figure 3:
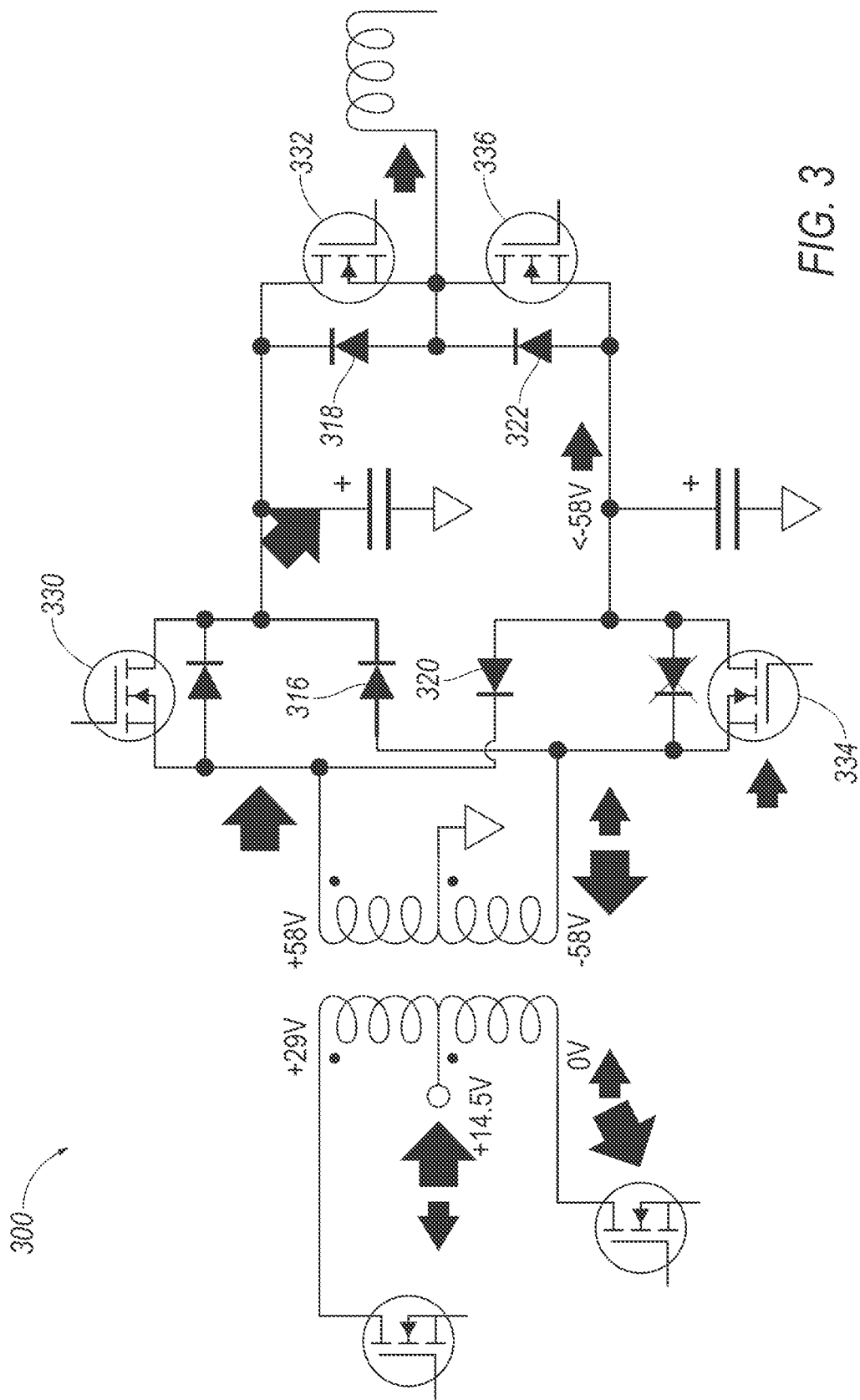
FIG. 3 illustrates current flow for operating during a positive portion of a cycle.
Figure 4:
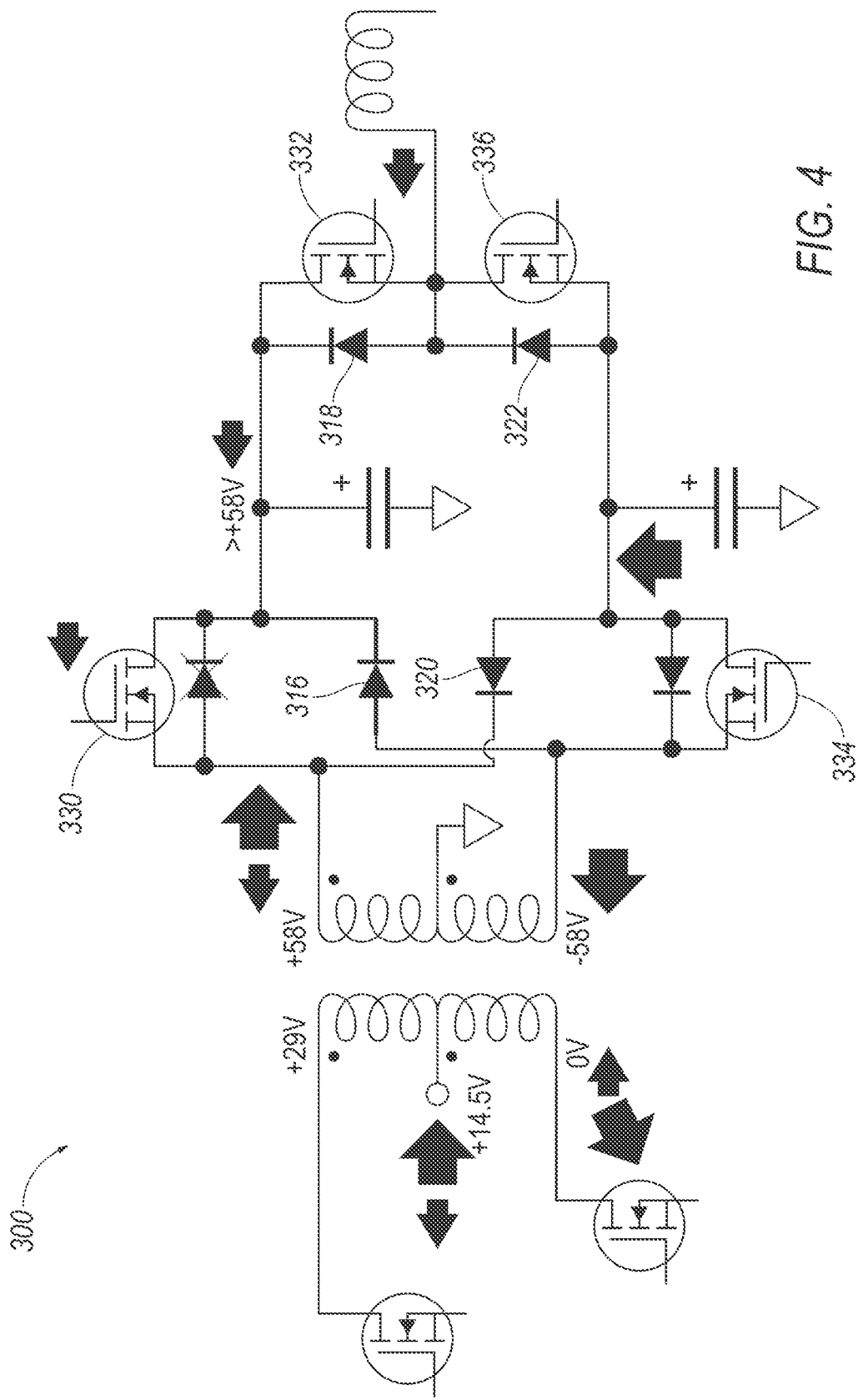
FIG. 4 illustrates current flow for operating during a negative portion of the cycle.

FIGS. 3 and 4 each illustrate and example schematic of another system 300 having a primary side 302 and a secondary side 304. FIG. 3 illustrates current flow for operating during a positive portion of the cycle. FIG. 4 illustrates current flow for operating during a negative portion of the cycle. This system 300 may be similar to FIG. 2 in that various MOSFET and diodes are controlled to mitigate rail pumping.

In the example show in FIG. 3, the system 300 includes half bride converter 311. At the secondary side, the system 300 may include a first diode 316, a second diode 318, a third diode 320, and a fourth diode 322. A first MOSFET 330 may be arranged parallel with the first diode 216, a second MOSFET 332 may be arranged parallel with the second diode 318, a third MOSFET 334 may be arranged in parallel with the third diode 320, and a fourth MOSFET 336 may be arranged in parallel with the fourth diode 322.

Similar to the system 200 of FIG. 2, certain components may operate simultaneously in order to allow reverse current from flowing through the opposite, unloaded side creating a synchronous rectification through the system 200. Such rectification aids in decreasing the pumping or boosting on the voltage rails 140, 142 and thus diminishes the affects of any rail pumping.

For example, the first MOSFET 330, the first diode 316, fourth MOSFET 336, and fourth diode 322 may all be active simultaneously when operating in the positive portion. The inductor current is consistently outward in this state. Any traditional rail pumping current travels via the third and fourth MOSFETS 334, 336. The first arrows 350 indicate the loaded side current flow while the second arrows 352 indicate the unloaded side current flow.

Referring to FIG. 4, when operating during the negative portion as the loaded side, inductor current is consistently inward. In this example, the second MOSFET 332, the second diode 318, third MOSFET 334, and third diode 320, may all be active simultaneously. Because the inductor current in consistently inward in this state, the rail pumping current travels via the first and second MOSFETS 330, 332. This allows currently flow back on the unloaded side, while allowing the second capacitor 344 to be charged while the first capacitor 342 is discharged. Because reverse current is permitted on the unloaded side, the power supply is able to recirculate this current to the opposite unloaded rail, clamping the effects of rail pumping.

Figure 5:
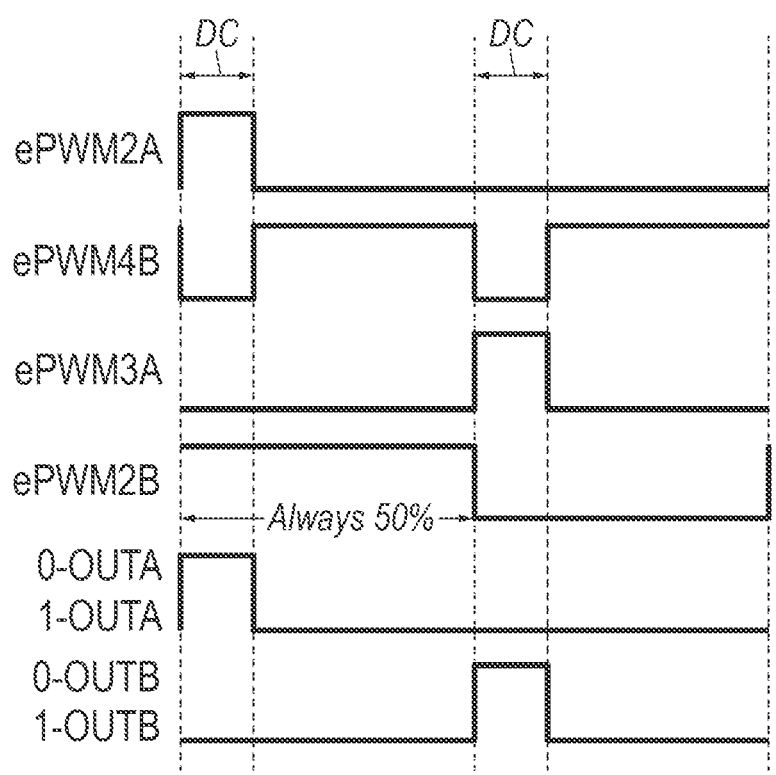
FIG. 5 illustrates a series of waveforms referenced in FIG. 2

FIG. 5 illustrates a series of waveforms referenced in FIG. 2. The waveforms may represent certain signals indicated on FIG. 2. Various driver inputs may be illustrated, for example, a first driver ePWM2A, first driver ePWM4B, second driver ePWM2B and second driver ePWM4B.

Accordingly, described herein is an amplifier system that uses MOSFETS to allow recirculating current to the opposing voltage rail to mitigate rail pumping. By adding synchronous rectification capabilities, the power supply is able to recirculate current to the unloaded voltage rail instead of blocking the current with traditional diode rectifiers.

The descriptions of the various embodiments have been presented for purposes of illustration, but are not intended to be exhaustive or limited to the embodiments disclosed. Many modifications and variations will be apparent to those of ordinary skill in the art without departing from the scope and spirit of the described embodiments.

Aspects of the present embodiments may be embodied as a system, method or computer program product. Accordingly, aspects of the present disclosure may take the form of an entirely hardware embodiment, an entirely software embodiment (including firmware, resident software, microcode, etc.) or an embodiment combining software and hardware aspects that may all generally be referred to herein as a "module" or "system." Furthermore, aspects of the present disclosure may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (erasable programmable read-only memory (EPROM) or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Aspects of the present disclosure are described above with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general-purpose computer, special purpose computer, or other programmable data processing apparatus to produce a machine, such that the instructions, which execute via the processor of the computer or other programmable data processing apparatus, enable the implementation of the functions/acts specified in the flowchart and/or block diagram block or blocks. Such processors may be, without limitation, general purpose processors, special-purpose processors, application-specific processors, or field-programmable.

The flowcharts and block diagrams in the figures illustrate the architecture, functionality, and operation of possible implementations of systems, methods and computer program products according to various embodiments of the present disclosure. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. An amplifier system, comprising:
   at least one input source;
   a converter configured to provide voltage rails to an amplifier, the voltage rails including a first voltage rail and a second voltage rail;
   a first metal-oxide-semiconductor field-effect transistor (MOSFET) arranged at a secondary side of the system at the first voltage rail;
   a second MOSFET arranged at the first voltage rail;
   a third MOSFET arranged at the second voltage rail;
   a fourth MOSFET arranged at the second voltage rail; and
   a first capacitor arranged at the first voltage rail and a second capacitor arranged at the second voltage rail, wherein the first and forth MOSFETS are configured to operate simultaneously with one another and wherein the second and third MOSFETs are configured to operate simultaneously with one another and opposite of the first and fourth MOSFETs so as to allow synchronous rectification so that the first capacitor and second capacitor reciprocally and mutually exclusively charge and discharge.

2. The system of claim 1, further comprising at least one diode associated with each of the MOSFETS, wherein each of the diodes is configured to operate simultaneously with the associated MOSFET to allow current to flow through the opposite one of the voltage rails.

3. The system of claim 2, wherein the at least one diode is arranged in parallel with the associated MOSFET.

4. The system of claim 1, further comprising at least one first ground diode arranged in parallel with a first driver at a first voltage rail side, the first ground diode configured to actively block current when the second MOSFET and third MOSFET are active.

5. The system of claim 4, further comprising at least one second ground diode arranged in parallel with a second driver at a second voltage rail side, the second ground diode configured to actively block current when the first MOSFET and fourth MOSFET are active.

6. An amplifier system, comprising:
   at least one input source;
   a converter configured to provide voltage rails to an amplifier, the voltage rails including a first voltage rail on a first side of the converter and a second voltage rail on a second side of the converter;
   at least one first MOSFET arranged at the first side;
   at least one second MOSFET arranged at the second side; and
   a first capacitor arranged at the first side and a second capacitor arranged at the second side, wherein the first and second MOSFETS are configured to operate singly from one another so as to allow synchronous rectification so that the first capacitor and second capacitor reciprocally and mutually exclusively charge and discharge to mitigate rail pumping.

7. The system of claim 6, further comprising at least one diode associated with each of the MOSFETS, wherein each of the diodes is configured to operate simultaneously with the associated MOSFET to allow current to flow through the opposite one of the sides of the converter.

8. The system of claim 6, wherein the at least one diode is arranged in parallel with the associated MOSFET.

9. The system of claim 6, further comprising at least one first ground diode arranged in parallel with a first driver at the first side.

10. The system of claim 6, further comprising at least one second ground diode arranged in parallel with a second driver at the second side.

11. An amplifier system, comprising:
    at least one input source;
    a converter configured to provide a first voltage rail and a second voltage rail to an amplifier;
    a first metal-oxide-semiconductor field-effect transistor (MOSFET) arranged at a secondary side of the system at the first voltage rail;
    a second MOSFET arranged at the second voltage rail;
    a first capacitor arranged at the first voltage rail and a second capacitor arranged at the second voltage rail, wherein the first and second MOSFETS are configured to operate singly from one another so as to allow synchronous rectification so that the first capacitor and second capacitor reciprocally and mutually exclusively charge and discharge to mitigate rail pumping; and
    at least one diode associated with each of the MOSFETS, wherein each of the diodes is configured to operate simultaneously with the associated MOSFET to allow current to flow through the opposite one of the voltage rails.

12. The system of claim 11, wherein the at least one diode is arranged in parallel with the associated MOSFET.

13. The system of claim 11, further comprising at least one first ground diode arranged in parallel with a first driver at a first voltage rail side, the first ground diode configured to actively block current when the second MOSFET is active.

14. The system of claim 13, further comprising at least one second ground diode arranged in parallel with a second driver at a second voltage rail side, the second ground diode configured to actively block current when the first MOSFET is active.

* * * * *